(12) United States Patent
Akiyama et al.

(10) Patent No.: US 7,272,460 B2
(45) Date of Patent: Sep. 18, 2007

(54) METHOD FOR DESIGNING A MANUFACTURING PROCESS, METHOD FOR PROVIDING MANUFACTURING PROCESS DESIGN AND TECHNOLOGY COMPUTER-AIDED DESIGN SYSTEM

(75) Inventors: Tatsuo Akiyama, Tokyo (JP); Masahiro Abe, Kanagawa (JP); Kenji Hirakawa, Tokyo (JP); Shigeru Komatsu, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 444 days.

(21) Appl. No.: 10/933,439

(22) Filed: Sep. 3, 2004

(65) Prior Publication Data
US 2005/0113951 A1 May 26, 2005

(30) Foreign Application Priority Data
Sep. 5, 2003 (JP) ............................ P2003-313806

(51) Int. Cl.
*G06F 19/00* (2006.01)
*G06F 17/00* (2006.01)

(52) U.S. Cl. ............................. 700/97; 700/90; 700/95

(58) Field of Classification Search .................. 700/95, 700/97, 108, 90; 703/2, 13
See application file for complete search history.

(56) References Cited
U.S. PATENT DOCUMENTS
6,772,035 B2 * 8/2004 Mouli ........................ 700/121
6,917,849 B1 * 7/2005 Pasadyn et al. .............. 700/121

FOREIGN PATENT DOCUMENTS
| JP | 09-246133 | 9/1997 |
| JP | 11-238655 | 8/1999 |
| JP | 2002-109446 | 4/2002 |

* cited by examiner

*Primary Examiner*—Alexander Kosowski
(74) *Attorney, Agent, or Firm*—Finnegan, Henderson, Farabow, Garrett & Dunner, L.L.P.

(57) ABSTRACT

A method for designing a manufacturing process of an electronic device includes calibrating a technology computer-aided design system by fitting simulation parameters of manufacturing process and electrical characteristic simulations, using first feature of commercial manufacturing process of first electronic device manufactured by first manufacturing facilities, and first electrical characteristic of the first electronic device; acquiring second feature of trial manufacturing process of second electronic device manufactured by second manufacturing facilities, and second electrical characteristic of the second electronic device; calculating simulation electrical characteristic of the second electronic device by substituting the second feature to the manufacturing process simulation corresponding to the trial manufacturing process; comparing the second electrical characteristic with the simulation electrical characteristic; and creating design specification of commercial manufacturing process of the second manufacturing facilities based on difference between the second electrical characteristic and the simulation electrical characteristic.

12 Claims, 11 Drawing Sheets

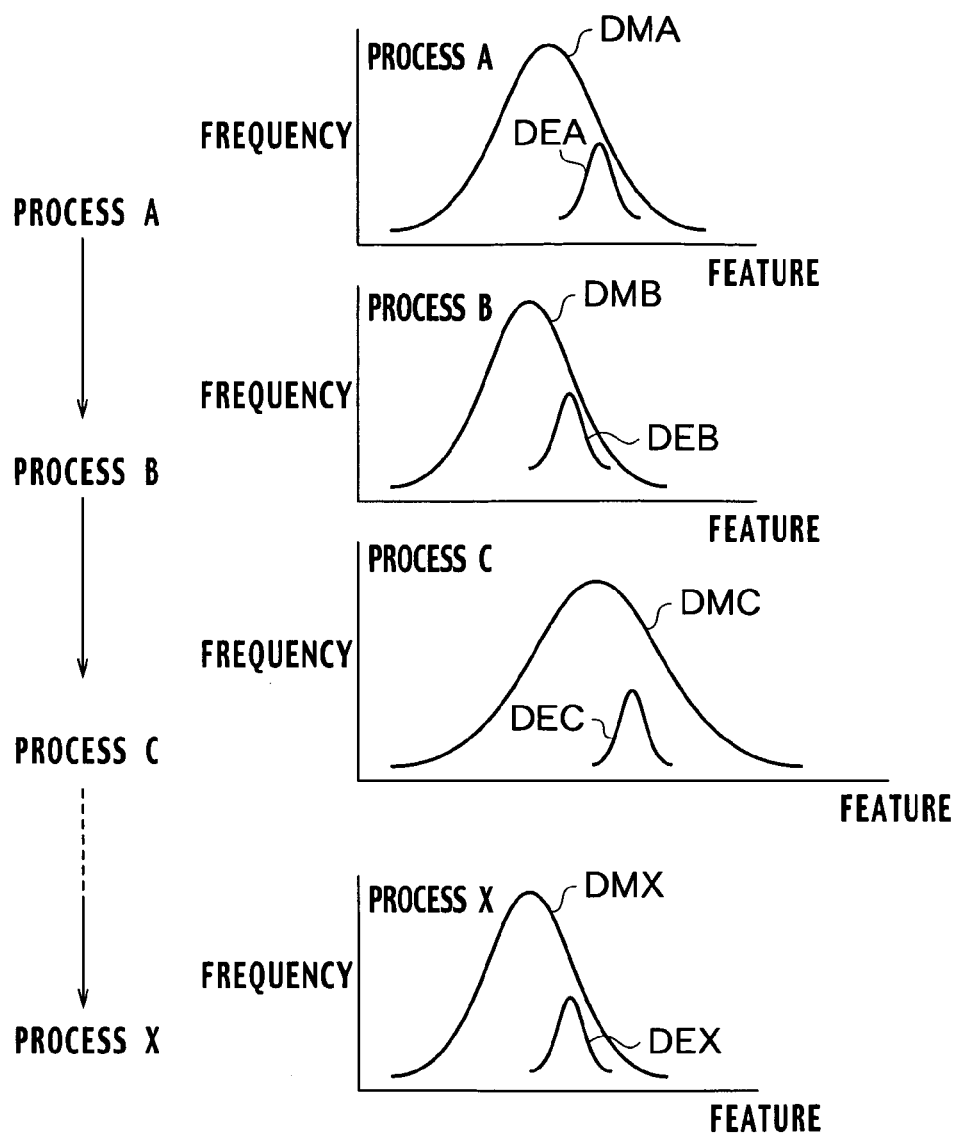
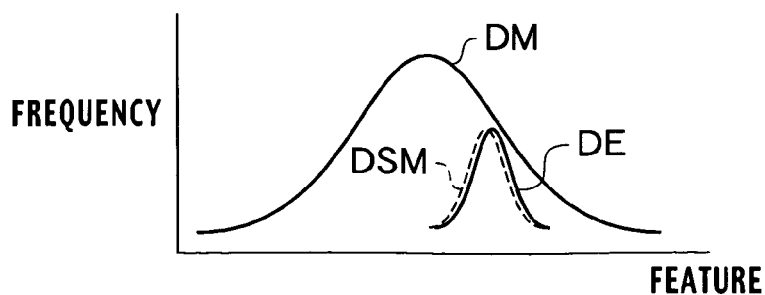

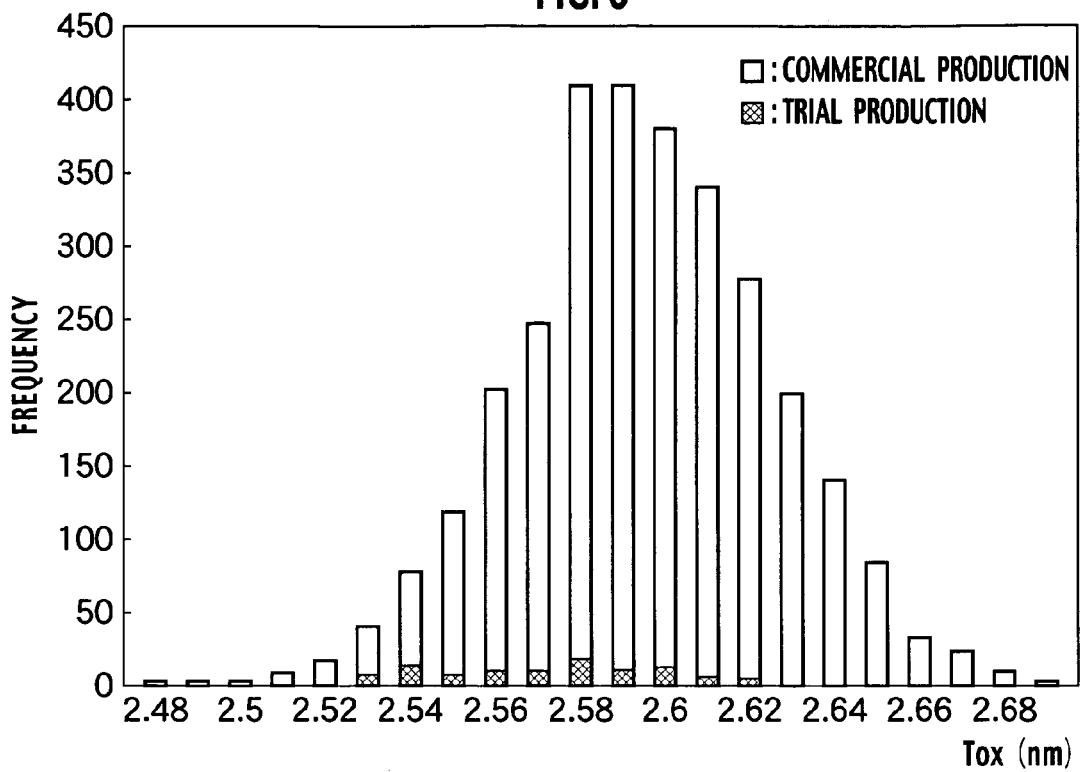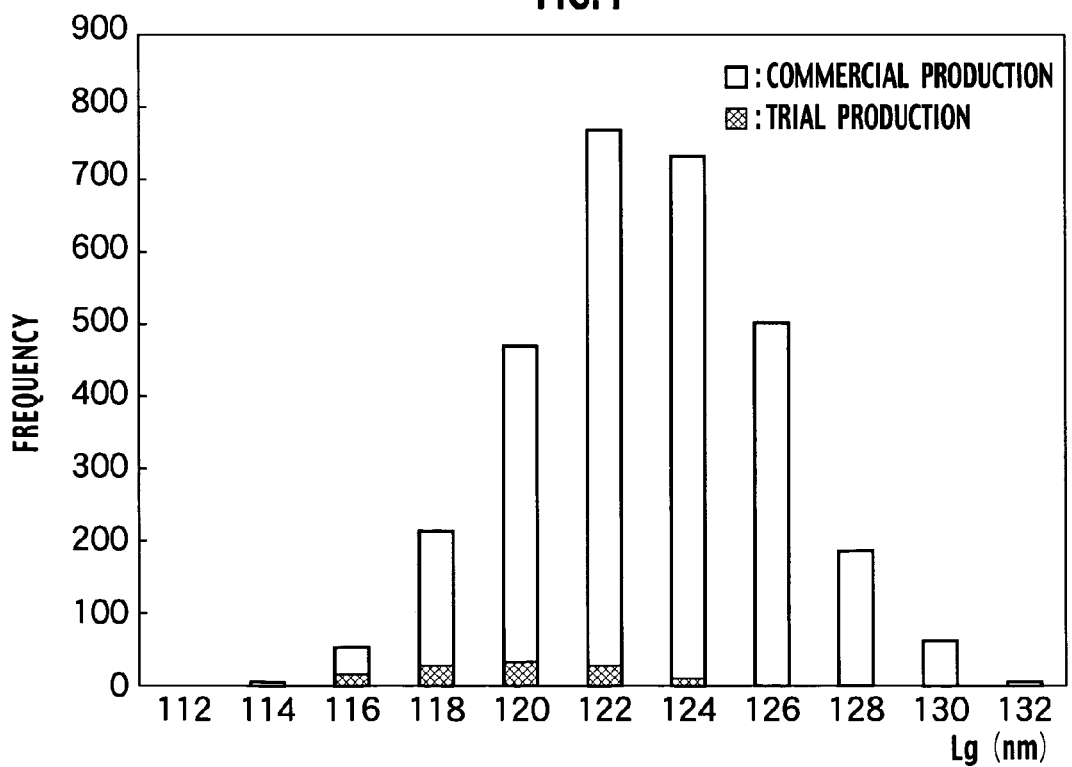

FIG. 10

| | TRIAL PRODUCTION (SAMPLE : 90) | | COMMERCIAL PRODUCTION (SAMPLE : 3000) | |
|---|---|---|---|---|
| | AVERAGE | VARIATION | AVERAGE | VARIATION |
| OXIDE FILM THICKNESS (Tox : nm) | 2.57 | 0.03 | 2.59 | 0.05 |
| GATE LENGTH (Lg : nm) | 121.51 | 2.95 | 122.00 | 3.58 |
| SPACER THICKNESS (Tsp : nm) | 110.98 | 0.57 | 110.06 | 1.49 |
| THRESHOLD VOLTAGE (Vth : V) | 0.54 | 0.02 | 0.53 | 0.06 |

METHOD FOR DESIGNING A MANUFACTURING PROCESS, METHOD FOR PROVIDING MANUFACTURING PROCESS DESIGN AND TECHNOLOGY COMPUTER-AIDED DESIGN SYSTEM

CROSS REFERENCE TO RELATED APPLICATIONS

This application is based upon and claims the benefit of priority from prior Japanese Patent Application P2003-313806 filed on Sep. 5, 2003; the entire contents of which are incorporated by reference herein.

BACKGROUND OF THE INVENTION

1. Field of the Invention

The present invention relates to a method for designing a manufacturing process, and particularly to a method for designing a manufacturing process of an electronic device and a method for providing a manufacturing process design of the same, using a technology development CAD system.

2. Description of the Related Art

A design of an electronic device, such as a semiconductor integrated circuit, has become finer and more multilayered in order to achieve high performance and high speed operation. The degree of integration of such an electronic device has also been increased dramatically. High-performance electronic devices are used in various kinds of products and have shorter product life cycles than ever before. Therefore, it is required to design such high-performance electronic devices which satisfy diverse needs, in a short period of time, and to develop a manufacturing technology that enables large item small scale production at low costs.

Normally, for designing and developing an electronic device, based on characteristics of an element, such as a transistor, manufactured in manufacturing facilities by way of trial process, model parameters of the element which represent operating characteristics are extracted. Thereafter, a circuit for the electronic device is designed using the model parameters. For developing a manufacturing process of such an electronic device designed as above, performance and operation of the electronic device manufactured in a trial production process are verified. Thus, by repeating the trial production process of the electronic device in manufacturing facilities, conditions for manufacturing are improved. In addition, when the manufacturing process developed as above is transferred to another manufacturing facilities or to a different factory, a trial production process is repeated to modify the manufacturing conditions.

Additionally, a method for designing and developing an electronic device is proposed. In the proposed method, design or defect analysis of an electronic device predicated on virtual trial production or the like, is efficiently implemented by using technology computer-aided design (TCAD). The TCAD simulates physical or chemical phenomena of a manufacturing process or an electronic device (Refer to Japanese Patent Laid-Open Publication No. 2002-109446.).

However, a manufacturing process of a high-performance and high-speed electronic device is complicated and requires a long period of time. Therefore, repeating trial production processes for modification of a manufacturing procedure does not reduce the development period of an electronic device. Moreover, a variation of a manufacturing condition in commercial production facilities is not taken into consideration for a trial production process of an electronic device. Thus, a characteristic distribution of trial products may deviate from an average of a characteristic distribution of commercial products. Alternatively, a characteristic distribution of trial products may be larger than a permissible limit of a characteristic variation of the commercial products. Furthermore, there are some manufacturing processes which are not or cannot be inspected in the trial production process. Hence, manufacture of the trial product within a management standard is not ensured in all manufacturing processes. Moreover, the method proposed in Japanese Patent Laid-Open Publication No. 2002-109446 is merely a method for automatically selecting simulation parameters essential for designing an electronic device, so as to improve simulation convergence, and a method for designing a manufacturing process of an electronic device is not disclosed.

SUMMARY OF THE INVENTION

A first aspect of the present invention inheres in a method for designing a manufacturing process of an electronic device including calibrating a technology computer-aided design system by fitting of simulation parameters of a manufacturing process simulation and an electrical characteristic simulation, the fitting performed by using a first feature of a first commercial manufacturing process of a first electronic device manufactured by first manufacturing facilities, and a first electrical characteristic of the first electronic device; acquiring a second feature of a trial manufacturing process of a second electronic device manufactured by second manufacturing facilities, and a second electrical characteristic of the second electronic device; calculating a simulation electrical characteristic of the second electronic device by substituting the second feature to a simulation manufacturing process of the manufacturing process simulation, the simulation manufacturing process corresponding to the trial manufacturing process; comparing the second electrical characteristic with the simulation electrical characteristic; and creating a design specification of a second commercial manufacturing process of the second manufacturing facilities based on a difference between the second electrical characteristic and the simulation electrical characteristic.

A second aspect of the present invention inheres in a method for providing a manufacturing process design of an electronic device to be manufactured in a factory using a technology computer-aided design system connected to the factory by a network including acquiring a first feature of a first commercial manufacturing process in commercial manufacturing facilities for a first electronic device, a first electrical characteristic of the first electronic device, a second feature of a trial manufacturing process in trial manufacturing facilities of a second electronic device, and a second electrical characteristic of the second electronic device, from the factory through the network; calibrating the technology computer-aided design system by fitting simulation parameters of a manufacturing process simulation and an electrical characteristic simulation using the first feature and the first electrical characteristic; calculating a simulation electrical characteristic of the second electronic device by substituting the second feature in a simulation manufacturing process of the manufacturing process simulation, the simulation manufacturing process corresponding to the trial manufacturing process; comparing the second electrical characteristic with the simulation electrical characteristic; creating a design specification of a second commercial manufacturing process of the second electronic device based on a difference between the second electrical characteristic and the simulation electrical characteristic; and providing the design specification to the factory through the network.

A third aspect of the present invention inheres in a technology computer-aided design system for designing a manufacturing process of an electronic device including an input module configured to acquire a first feature of a first commercial manufacturing process in commercial manufacturing facilities for a first electronic device, a first electrical characteristic of the first electronic device, a second feature of a trial manufacturing process in trial manufacturing facilities of a second electronic device, and a second electrical characteristic of the second electronic device; a simulation module calibrated by fitting simulation parameters of a manufacturing process simulation and an electrical characteristic simulation using the first feature and the first electrical characteristic, configured to calculate a simulation electrical characteristic of the second electronic device by substituting the second feature in a simulation manufacturing process of the manufacturing process simulation, the simulation manufacturing process corresponding to the trial manufacturing process; a specification creation module configured to create a design specification of a second commercial manufacturing process of the second electronic device based on a difference between the second electrical characteristic and the simulation electrical characteristic; and an output module configured to transmit the design specification to the trial manufacturing facilities. dr

BRIEF DESCRIPTION OF DRAWINGS

FIG. 2 is a schematic view for explaining exemplary frequency distributions of features of manufacturing processes according to the first embodiment of the present invention;

FIG. 3 is a schematic view for explaining exemplary frequency distributions of a feature of an electronic device according to the first embodiment of the present invention;

FIG. 6 is a schematic view showing an exemplary frequency distribution of an oxide film thickness according to the first application of the first embodiment of the present invention;

FIG. 7 is a schematic view showing an exemplary frequency distribution of a gate length according to the first application of the first embodiment of the present invention;

FIG. 10 is an exemplary table showing an average and a variation of features of a gate structure according to the first application of the first embodiment of the present invention;

DETAILED DESCRIPTION OF THE INVENTION

Figure 1:
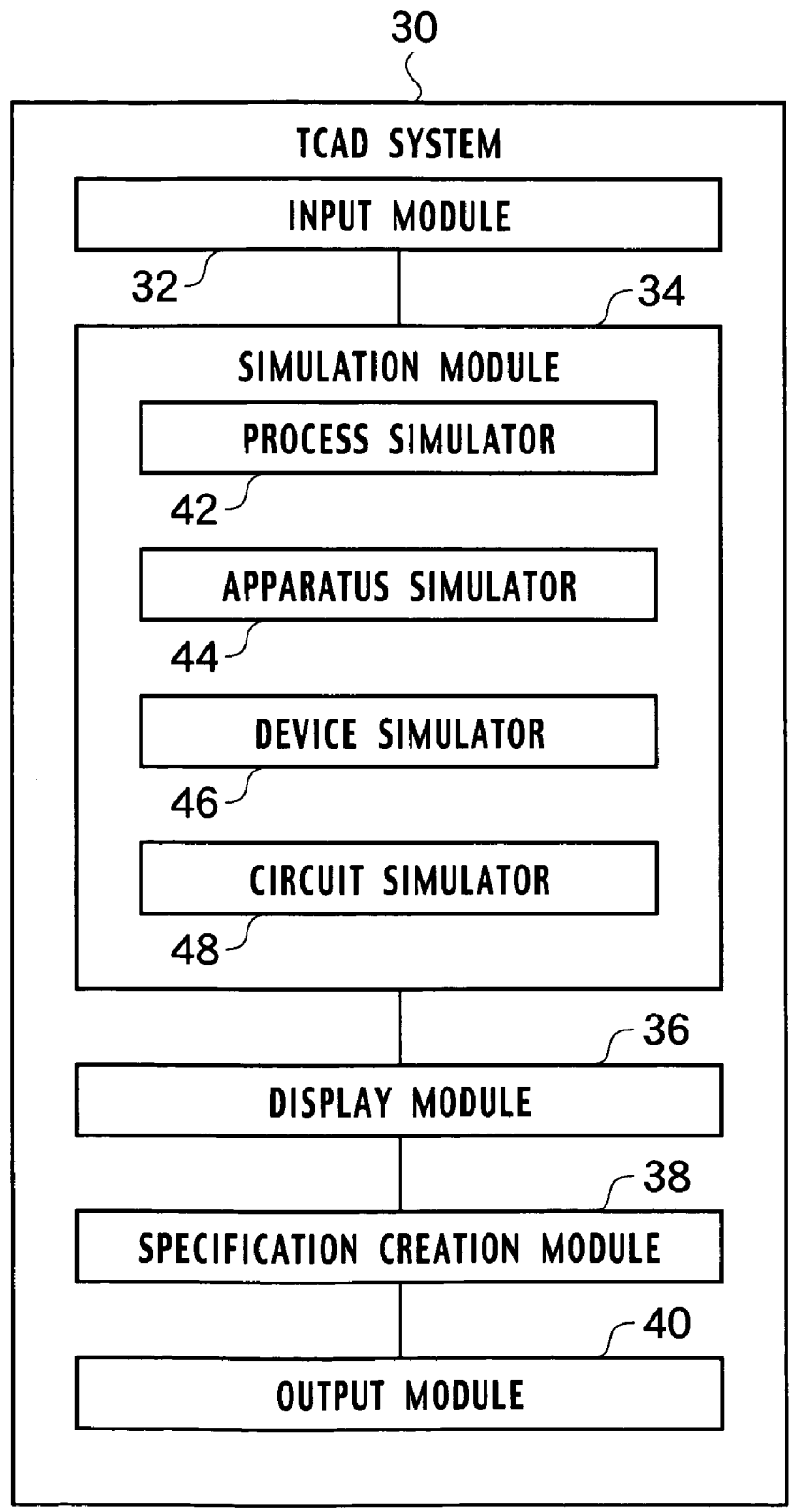
FIG. 1 is a schematic block diagram showing an exemplary TCAD system according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

FIRST EMBODIMENT

A TCAD system 30 used in a method for designing a manufacturing process according to a first embodiment of the present invention, includes an input module 32, a simulation module 34, a display module 36, a specification creation module 38, and an output module 40, as shown in FIG. 1. The input module 32 acquires design information of an electronic device and manufacturing information of manufacturing facilities. The simulation module 34 calculates an element shape and impurity distribution based on the design information and the manufacturing information so as to simulate device characteristics and device performance. The display module 36 displays the design information, the manufacturing information, a simulation result, and the like. The specification creation module 38 creates a manufacturing process specification of the electronic device based on the simulation result. The output module 40 transmits the created manufacturing process specification to the manufacturing facilities. The input module 32 and the output module 40 are connected to commercial production facilities and trial production facilities, or various databases, through a local area network (LAN) or the like. The simulation module 34 includes a process simulator 42, an apparatus simulator 44, a device simulator 46, a circuit simulator 48, and the like.

When an electronic device, such as a semiconductor device is manufactured, the process simulator 42 calculates a process for treating and processing a semiconductor substrate, following a manufacturing process flow. The process simulator 42 includes an impurity simulator and a shape simulator. The impurity simulator mainly deals with ion implantation, thermal oxidation, and impurity diffusion. The shape simulator deals with deposition and etching of a thin film. The apparatus simulator 44 acquires a structure of a target manufacturing apparatus and a process recipe, and calculates a physical and chemical model of plasma, a surface reaction, or the like within a processing chamber and the like of the manufacturing apparatus. For example, when a target apparatus is a semiconductor device manufacturing apparatus, the apparatus simulator 44 simulates processes of film growth and etching on a semiconductor substrate. The device simulator 46 calculates the internal state and electrical characteristics of the electronic device, based on the device structure including impurity distribution obtained by the process simulator 42. The device simulator 46 can implement a steady state analysis and a transient analysis to provide a distribution of potential, a distribution of carrier density, distribution of lattice temperature, and the like. As a result, the device simulator 46 provides electrical characteristics such as a current-voltage characteristic and the like. The circuit simulator 48 describes an electrical network of the electronic device, basically using Kirchhoff law and numerically calculates the electrical network so as to provide a circuit operation. For example, a current-voltage characteristic of a transistor, which is a non-linear element of an electronic device, is provided using the model parameters of an analytical approximate expression describing the transistor operation. The characteristics are fitted to a current-voltage characteristic of the transistor calculated by the device simulator 46 or obtained by actual measurement. The fitting processing is called parameter extraction. A dedicated extraction program such as SPICE is used for the fitting processing.

Description is provided regarding an exemplary case where trial production is implemented in order to transfer a commercial manufacturing process flow of an electronic device to other manufacturing facilities. The electronic device is manufactured through processes A, B, C, . . . , X as shown in FIG. 2. Here, manufacturing facilities (first manufacturing facilities), where commercial production of an electronic device is currently implemented, are referred to as commercial production facilities. Manufacturing facilities (second manufacturing facilities), to which the commercial manufacturing will be transferred later, are referred to as transfer target facilities. In the transfer target facilities, small scale trial manufacturing processes are implemented using a manufacturing apparatus recipe and a manufacturing process recipe which correspond to the commercial production facilities, based on the design specification of the electronic device. For example, in manufacturing a semiconductor device, features such as a pattern width, a deposited film thickness, an etching depth, an impurity doping concentration, a contact resistance, and a dielectric strength, are measured by a test element group (TEG), a sampling inspection and the like, in each of the processes A, B, C, . . . , X. FIG. 2 shows frequency distribution data DMA, DMB, DMC, . . . , DMX of the features (first features) in the commercial production facilities, measured in the processes of A, B, C, . . . , and X, respectively. FIG. 2 also shows frequency distribution data DEA, DEB, DEC, . . . , DEX of the features (second features) in the transfer target facilities. Products are manufactured predominantly in the commercial production facilities over a long period of time. Consequently, in the manufacturing processes of such commercial production facilities, the manufacturing apparatus condition and the manufacturing process condition may vary from the conditions described in the manufacturing apparatus recipe and manufacturing process recipe. Thus, by comparing the frequency distribution data DMA, DMB, DMC, . . . , DMX of the commercial manufacturing processes with the frequency distribution data DEA, DEB, DEC, . . . , DEX of the trial manufacturing processes, the center values of the first features or the averages of the first features deviate from those of the second features and the range of variations increase. Further, as shown in FIG. 3, frequency distribution data DM and DE of features, such as an electrical characteristic of the electronic device manufactured in the commercial production facilities and the transfer target facilities, respectively, are different from each other. Therefore, it is a problem to estimate averages and variations of the electrical characteristics of the electronic device from data of the small scale trial production, when commercial production of the electronic device is implemented in the transfer target facilities.

In the first embodiment, the TCAD system 30 shown in FIG. 1 provides the frequency distribution data of the features in the manufacturing processes in the commercial production facilities, as parameters, to the manufacturing apparatus condition and manufacturing process condition of the transfer target facilities so as to implement the simulation. The TCAD system 30 then verifies the trial manufacturing processes, to which the commercial manufacturing processes will be transferred later. First, the process simulator 42 and the apparatus simulator 44 simulate the manufacturing processes of the commercial production facilities by use of the averages and variations of the frequency distribution data DMA, DMB, DMC, DMX of the features of the commercial manufacturing processes measured in the processes A, B, , C . . . , X, respectively. Thereafter, based on a result of the simulation, the device simulator 46 and the circuit simulator 48 calculate electrical characteristics of an electronic circuit of a commercial product. Calculation of the electrical characteristics is performed by fitting simulation parameters so as to correspond to the measured electrical characteristics (first electrical characteristics) of the commercial product. Thus, the simulation module 34 of the TCAD system 30 is calibrated based on the frequency distribution data of the current commercial manufacturing processes.

Next, the process simulator 42 and the apparatus simulator 44 simulate the manufacturing processes of the transfer target facilities by use of the averages and variations of the frequency distribution data DEA, DEB, DEC, . . . , DEX of the features of the trial manufacturing processes measured in the processes A, B, C, . . . , X, respectively. Thereafter, based on the simulation result, the device simulator 46 and the circuit simulator 48 calculate electrical characteristics of an electronic device. Thus, the TCAD system 30 is calibrated in advance, based on the frequency distribution data of the current commercial manufacturing processes. The features of simulation electrical characteristics obtained from the simulation by the TCAD system 30 are compared with the measured electrical characteristics (the second characteristics) obtained from the trial product manufactured in the transfer target facilities. For example, as shown in FIG. 3, the frequency distribution data DSM of the feature obtained from the simulation is within a permissible limit, with respect to the frequency distribution data DE of the trial product. In this case, it is determined that the average and variation of the electrical characteristic of an electronic device are approximately the same as those of an electronic device from the current commercial production facilities, when commercial production is implemented in the transfer target facilities. The model parameters, which express the electrical characteristics of the commercial product extracted based on the features of the commercial production facilities, are provided as a design specification of the commercial manufacturing processes for the manufacturing facilities where trial production was implemented.

In the first embodiment, the electrical characteristic data measured from a trial product in the transfer target facilities are compared to the simulation electrical characteristic data provided by the simulation module 34 of the TCAD system 30 by using data of the trial manufacturing processes. The simulation module 34 is calibrated based on the commercial production data of the current commercial production facilities. Therefore, the simulation electrical characteristic data corresponding to the commercial product can be obtained, even where the number of trial lots in the transferred production facilities is small. Consequently, the commercial manufacturing processes can be effectively designed in a short period of time for the manufacturing facilities where trial production has been implemented.

FIRST APPLICATION OF THE EMBODIMENT

Figure 4:
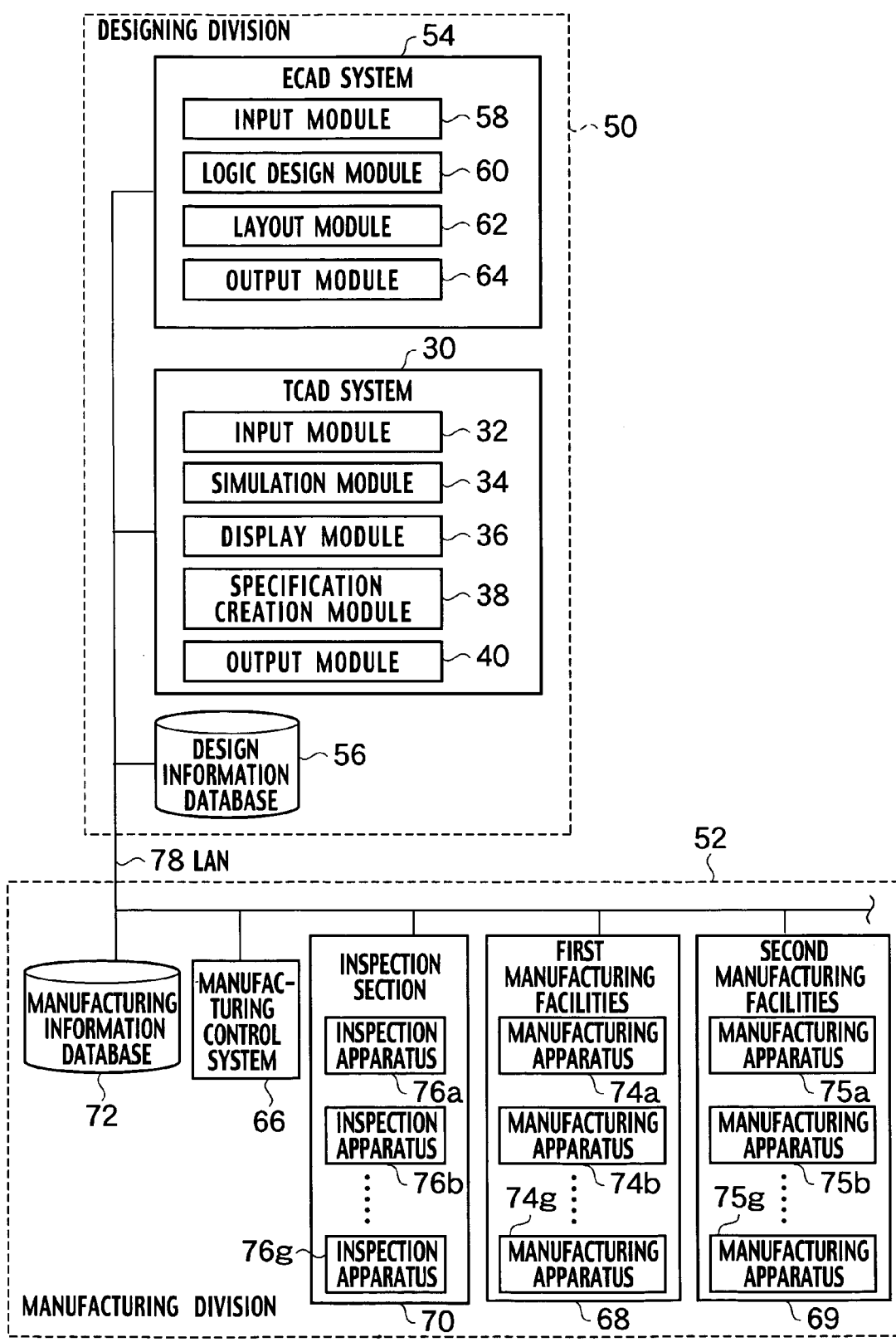
FIG. 4 is a schematic block diagram showing an exemplary factory for explaining a design method for a manufacturing process according to the first embodiment of the present invention.

In a first application of the first embodiment of the present invention, description is provided regarding a case where the method for designing a manufacturing process of the first embodiment is applied to transfer manufacturing processes to other manufacturing facilities within a factory. In the factory, semiconductor devices are manufactured. As shown in FIG. 4, the factory has, for example, a designing division 50 and a manufacturing division 52. In the designing division 50, a circuit of a semiconductor device and a layout of a photomask are designed, and manufacturing processes, device characteristics, and the like, of semiconductor device are simulated. In the manufacturing division 52, semiconductor device is manufactured and inspected. The designing division 50 and the manufacturing division 52 are connected to each other through a local area network (LAN) 78 or the like.

The designing division 50 is provided with an engineering CAD (ECAD) system 54 and a design information database 56, in addition to the TCAD system 30. The ECAD system 54 includes a logic design module 60, a layout module 62, an input module 58 and an output module 64.

The logic design module 60 designs a logic circuitry of a semiconductor device based on a semiconductor device specification requested by a customer, including an in-house user. The layout module 62 designs a layout pattern of the deigned logic circuitry by graphic data processing. The input module 58 and the output module 64 connect the logic design module 60 and the layout module 62 with the design information database 56 and the like, through the LAN 78.

The design information database 56 stores the specification of the logic circuitry of the semiconductor device designed by the logic design module 60. The design information database 56 also stores the layout pattern of the logic circuitry designed by the layout module 62. The design information database 56 may further store various simulation parameters of the TCAD system 30, a specification of manufacturing processes of a semiconductor device created by simulation, and the like. Note that a plurality of photomasks for manufacturing a semiconductor device is fabricated by a mask fabrication section in the manufacturing division 52 or an external mask maker (not shown)

The manufacturing division 52 includes a manufacturing control system 66 which controls manufacturing in the entire manufacturing division 52, a plurality of commercial manufacturing facilities, an inspection section 70, and a manufacturing information database 72. The plurality of commercial manufacturing facilities includes, for example, first manufacturing facilities 68 and second manufacturing facilities 69. In the inspection section 70, various inspections for monitoring the manufacturing processes and measuring electrical characteristics are conducted. The manufacturing information database 72 stores information of manufacturing apparatuses in the plurality of commercial manufacturing facilities, such as the first and second manufacturing facilities 68 and 69. The manufacturing information database 72 also stores various inspection data provided in the inspection section 70.

In the first and second manufacturing facilities 68 and 69, a plurality of manufacturing apparatuses 74a, 74b, . . . , 74g, and 75a, 75b, . . . , 75g are provided, respectively. The manufacturing apparatuses 74a to 74g and 75a to 75g include, an oxidation furnace, a chemical vapor deposition (CVD) apparatus, a plasma CVD apparatus, an epitaxial growth apparatus, a photolithography system, an ashing apparatus, a dry etching apparatus such as a reactive ion etching (RIE) apparatus, a thermal diffusion apparatus, an ion implantation apparatus, an annealing apparatus, and the like. The manufacturing apparatuses 74a to 74g and 75a to 75g conduct manufacturing processes including an oxidation process, a deposition process, a photolithography process, an etching process, a diffusion process, an ion implantation process, an annealing process, and the like.

The inspection section 70 is provided with a plurality of inspection apparatuses 76a, 76b, . . . , 76g. The inspection apparatuses 76a to 76g include an ellipsometer, a reflection high energy electron diffraction (RHEED) apparatus, an Auger electron spectroscopy (AES) apparatus, an infrared spectroscopy apparatus, a plasma spectroscopy apparatus, and the like, which are capable of in-situ evaluations of an etching depth, a film thickness, a gas analysis including plasma, and the like, during manufacturing processes such as dry etching, deposition, and the like. The inspection apparatuses 76a to 76g also include an optical overlay inspection apparatus, a scanning electron microscope (SEM), and the like, which inspect a pattern size of a circuit and misalignment of a pattern, during the manufacturing processes. The inspection apparatuses 76a to 76g further include an interference microscope, a surface profiler, a focused-ion beam (FIB) apparatus, an atomic force microscope (AFM), an electrical characteristics measuring apparatus, and the like, which evaluate a film thickness, an etching depth, distribution of impurity concentration, electrical characteristics, and the like, by mainly using a TEG. The inspection apparatuses 76a to 76g further include an IC tester and the like, which conduct an on-wafer evaluation of electrical characteristics after completion of the manufacturing processes.

The manufacturing information database 72 stores a manufacturing process flow, a manufacturing apparatus recipe, a manufacturing process recipe, information of the respective manufacturing apparatuses 74a to 74g and 75a to 75g provided in the first and second manufacturing facilities 68 and 69, various inspection data measured by the inspection section 70, and the like.

Figure 5:
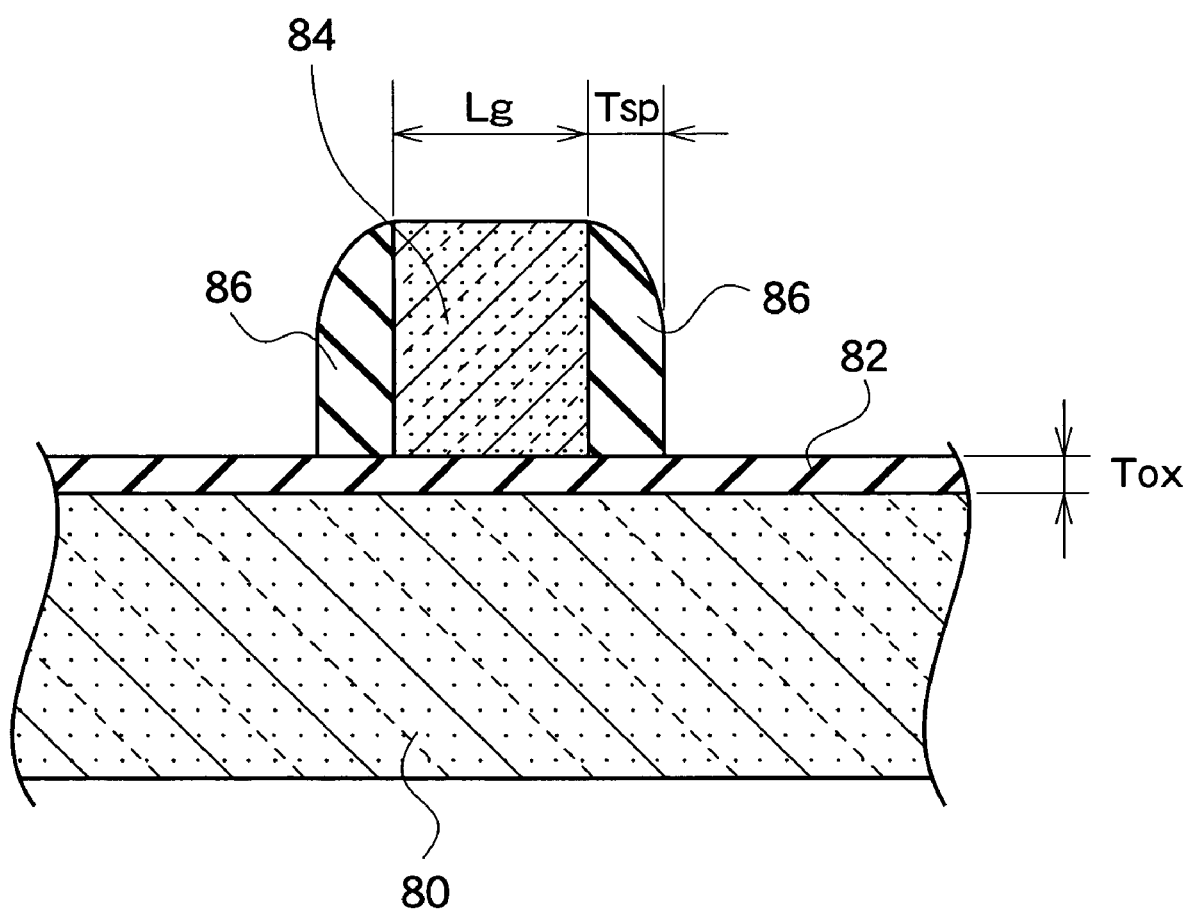
FIG. 5 is a schematic cross-sectional view showing an exemplary manufacturing process according to a first application of the first embodiment of the present invention.

An example is described using an oxide film thickness Tox of a gate oxide 82, a gate length Lg of a gate electrode 84 and a spacer thickness Tsp of a spacer 86, which are features of a gate structure of a metal oxide semiconductor (MOS) transistor, as shown in FIG. 5. In a gate fabrication process, the gate oxide 82 is first formed on the surface of a semiconductor substrate 80 by thermal oxidation. A polysilicon film is deposited on the gate oxide 82 by a CVD technique, and the gate electrode 84 is fabricated by a photolithography technique. Next, an oxide film is deposited by a CVD technique, and the spacers 86 are formed on sidewalls of the gate electrode 84 by anisotropic etching using an RIE technique.

For example, in order to transfer commercial manufacturing of a semiconductor device, which has already been implemented in the first manufacturing facilities 68 shown in FIG. 4, to the second manufacturing facilities 69, the semiconductor device is manufactured for trial in the second manufacturing facilities 69. Feature data of commercial manufacturing processes and commercial products in the first manufacturing facilities 68 are stored in the manufacturing information database 72. The number of samples for the commercial products is 3000. The manufacturing control system 66 determines a manufacturing apparatus condition and a manufacturing process condition of the second manufacturing facilities 69, based on the manufacturing apparatus recipe and the manufacturing process recipe of the first manufacturing facilities 68. Trial manufacturing of the semiconductor devices is implemented ninety times under the manufacturing apparatus condition and the manufacturing process condition of the second manufacturing facilities 69. Measured feature data of trial manufacturing processes and trial products are stored in the manufacturing information database 72.

Figure 8:
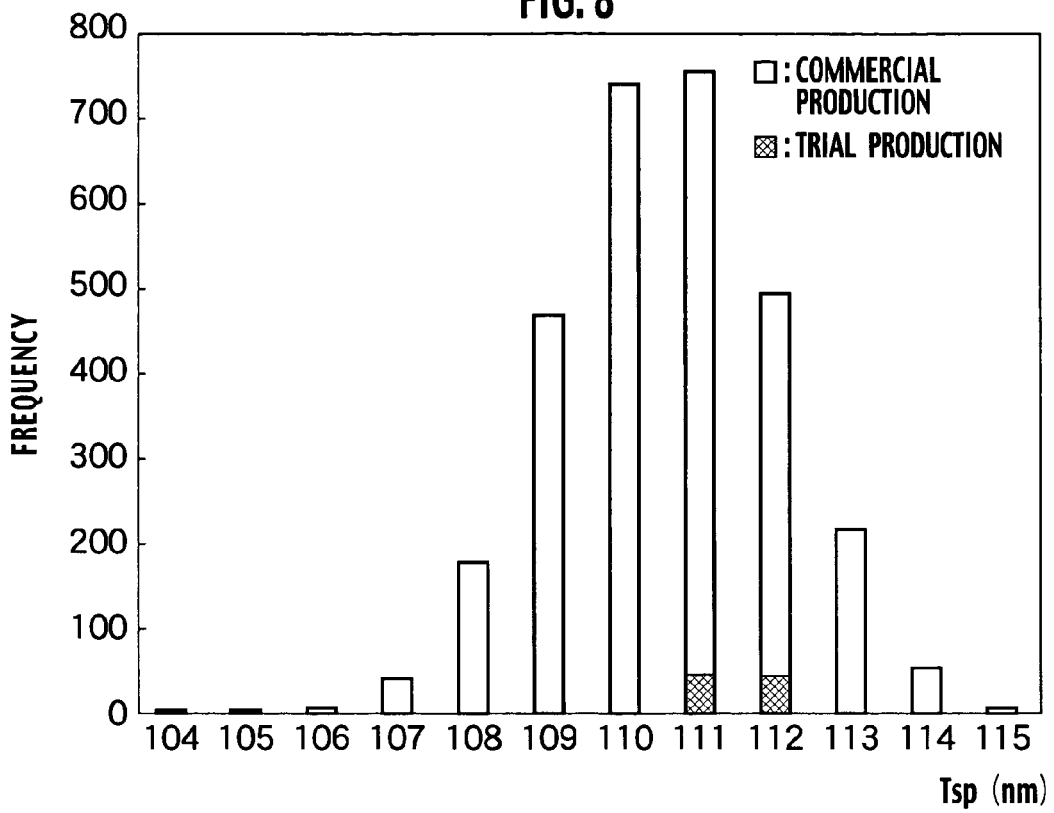
FIG. 8 is a schematic view showing an exemplary frequency distribution of a spacer thickness according to the first application of the first embodiment of the present invention.
Figure 9:
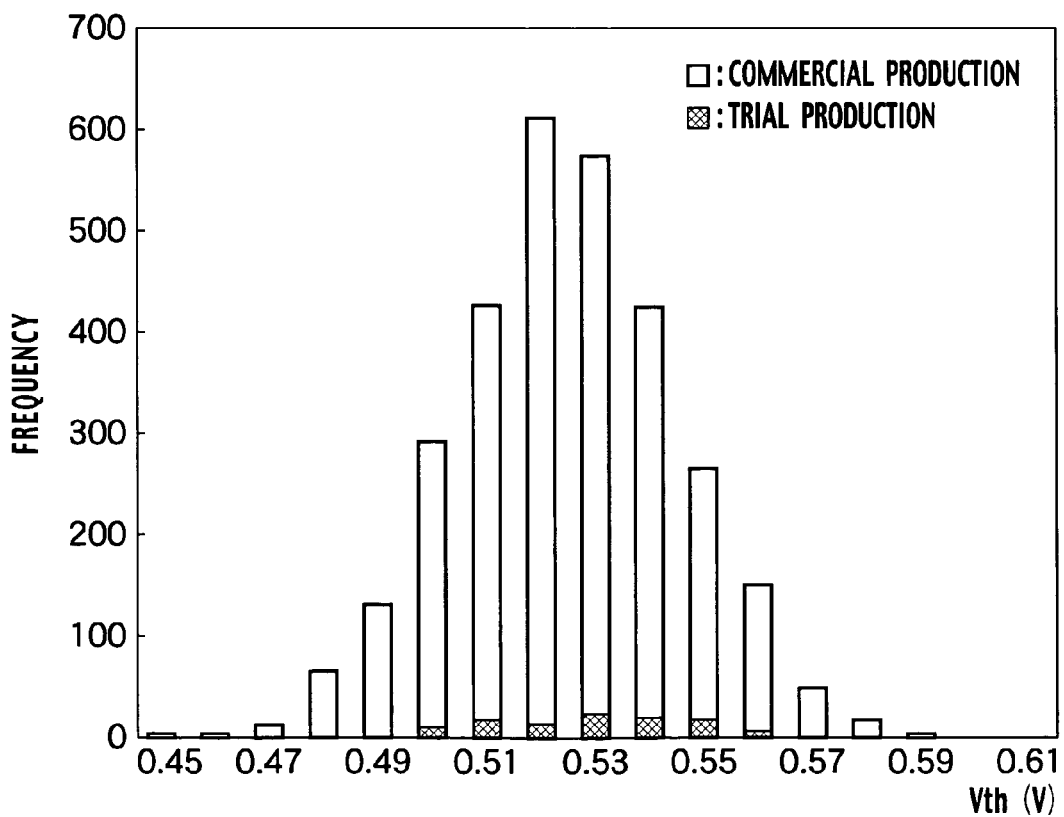
FIG. 9 is a schematic view showing an exemplary frequency distribution of a threshold voltage according to the first application of the first embodiment of the present invention.

The TCAD system 30 respectively acquires the feature data of the commercial manufacturing processes and the commercial products of the first manufacturing facilities 68, and the feature data of the trial manufacturing processes and the trial products of the second manufacturing facilities 69, by the input module 32 through the LAN 78 from the manufacturing information database 72. The feature data of the commercial manufacturing processes, the trial manufacturing processes, the commercial products, and the trial products, can be displayed on the display module 36. For example, frequency distributions of the oxide film thickness Tox of the gate oxide 82, the gate length Lg of the gate electrode 84, and the spacer thickness Tsp of the spacer 86, are shown in FIGS. 6 to 8, as features of the commercial manufacturing processes and trial manufacturing processes. Further, frequency distributions of threshold voltage Vth of MOS transistors manufactured as the commercial products and the trial products are shown in FIG. 9. As shown in FIG. 10, averages of the respective features of the trial products, which are provided from the frequency distributions of FIGS. 6 to 9, correspond to averages of the commercial products within permissible errors, respectively. Additionally, variations of the respective features of the trial products are within variations of the commercial products. Here, it is determined whether the averages and variations of the respective features of the trial product are within ranges estimated by simulation of commercial production.

Consequently, the TCAD system 30 is first calibrated by use of the feature data of the commercial manufacturing processes. The process simulator 42 and the apparatus simulator 44 of the simulation module 43 simulate the manufacturing processes of the first manufacturing facilities 68, by use of the averages and the variations of the measured feature data of the commercial manufacturing processes. Based on a result of the manufacturing process simulation, the device simulator 46 and the circuit simulator 48 calculate electrical characteristics of the semiconductor device by fitting simulation parameters using the feature data of the commercial manufacturing processes, so as to correspond to the measured electrical characteristics of the commercial product. Thus, the simulation module 34 of the TCAD system 30 is calibrated by use of the feature data of the commercial manufacturing processes.

Next, the process simulator 42 and the apparatus simulator 44 of the calibrated simulation module 34 simulate manufacturing processes of the second manufacturing facilities 69 by use of the averages and the variations of the feature data of the trial manufacturing processes. Based on the result of the manufacturing process simulation, the device simulator 46 and the circuit simulator 48 calculate electrical characteristics of a semiconductor device manufactured as a commercial product. An average and a variation of the threshold voltage Vth of, for example, a MOS transistor are calculated from the calculated electrical characteristics, and displayed on the display module 36.

When differences in the average and the variation between the threshold voltage Vth measured in the trial products and the threshold voltage Vth calculated in the simulation are within permissible limits, the specification creation module 38 creates a manufacturing process design specification of the second manufacturing facilities 69 by use of the averages and the variations of the features of the commercial products from the first manufacturing facilities 68. More specifically, the model parameters of the semiconductor device manufactured as the commercial products are extracted by the TCAD system 30 and used for design of a logic circuitry for commercial production in the second manufacturing facilities 69.

Alternatively, when differences in the average and the variation between the-threshold voltage Vth measured in the trial products and the threshold voltage Vth calculated in the simulation exceed permissible limits, the TCAD system 30 verifies the trial manufacturing processes. When any abnormality is found in the manufacturing apparatus condition or the manufacturing process condition, the abnormal manufacturing apparatus condition or abnormal manufacturing process condition is modified. The modified manufacturing apparatus condition or the modified manufacturing process condition is transmitted from the output module 40 to the manufacturing control system 66 of the manufacturing division 52. Thereafter, other trial production is implemented in the second manufacturing facilities 69. Other trial products manufactured by the other trial production is then measured and simulated in a manner similar to those for the trial products before modification of the manufacturing apparatus condition or the manufacturing process condition. When there is no abnormality in the manufacturing apparatus condition or the manufacturing process condition, by verifying the commercial manufacturing processes, the simulation module 34 of the TCAD system 30 is recalibrated. By the recalibrated TCAD system 30, simulation for the trial products is newly implemented. Thereafter, the simulation electrical characteristics of the trial products and the measured electrical characteristics are compared again. Processing is repeated until the differences between the simulation electrical characteristics and the measured electrical characteristics are within permissible limits. Thus, the obtained model parameters are provided for a manufacturing process design specification for the commercial production.

The manufacturing process design specification created as above for the second manufacturing facilities 69 is transmitted from the output module 40 and stored in the manufacturing information database 72 of the manufacturing division 52. The manufacturing control system 66 controls the second manufacturing facilities 69 to implement commercial manufacturing of a semiconductor device, based on the manufacturing process design specification for the second manufacturing facilities 69 stored in the manufacturing information database 72. Note that the manufacturing process design specification may be temporally stored in the design information database 56 of the designing division 50.

In the first application of the first embodiment, by calibrating the TCAD system 30 using the averages and the variations of the features of the commercial manufacturing processes, commercial production corresponding to the trial manufacturing processes can be simulated. Therefore, commercial manufacturing processes in manufacturing facilities, where small scale trial production has been implemented, can be effectively designed in a shorter period of time.

SECOND APPLICATION OF THE FIRST EMBODIMENT

Figure 11:
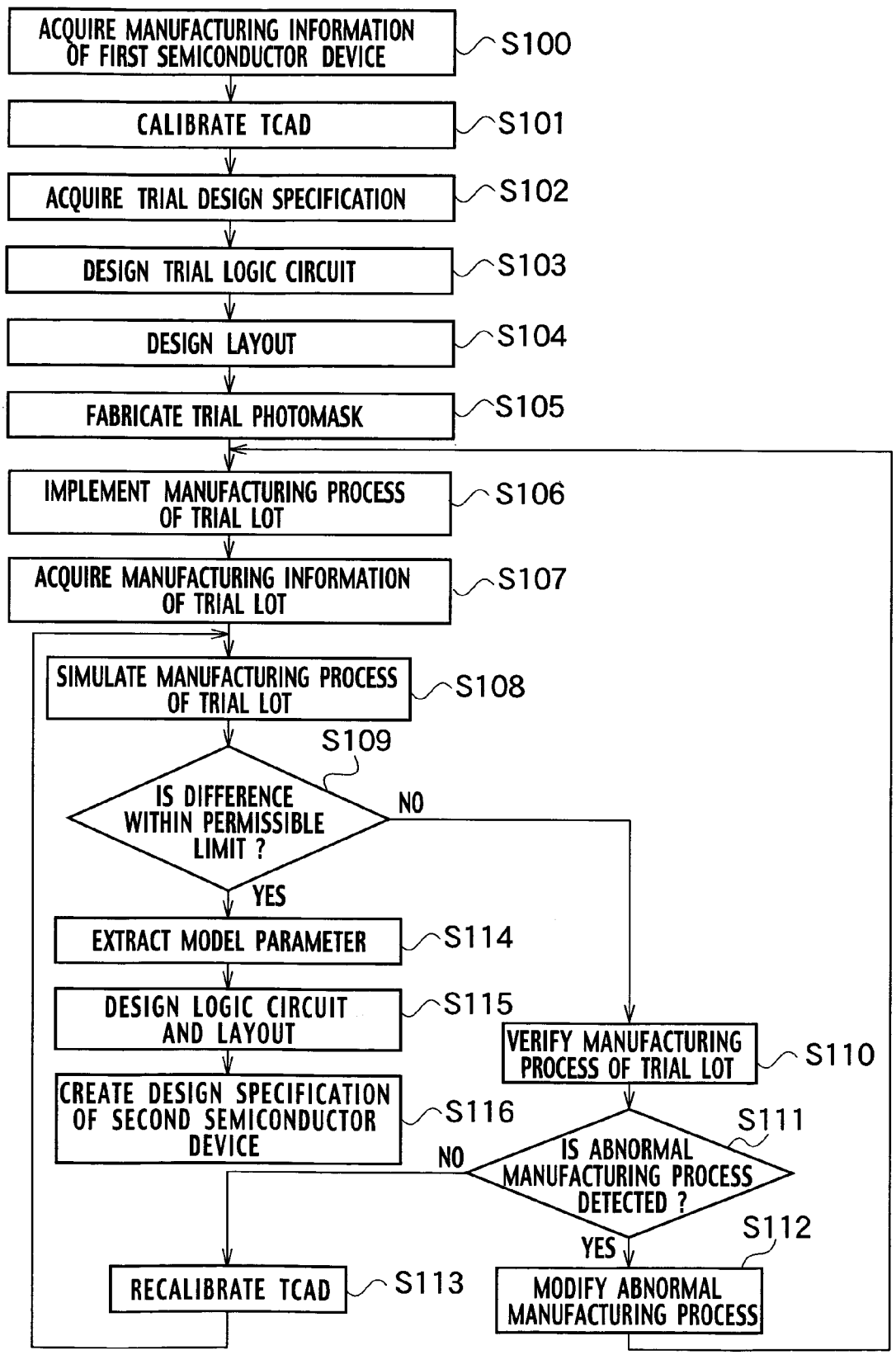
FIG. 11 is a flowchart for describing a design method for a manufacturing process according to a second application of the first embodiment of the present invention.

In the first application of the first embodiment, the manufacturing processes of the commercial manufacturing facilities are transferred to other manufacturing facilities without any change in a semiconductor device structure. However, in some cases, that a semiconductor device should be manufactured under a different manufacturing condition in response to customer needs. In a second application of the first embodiment, a method for designing a manufacturing process is described with reference to a flowchart shown in FIG. 11, when a customer requests a MOS transistor having a lower threshold voltage or a semiconductor device having a lower power consumption. For simplification of explanation, as with the first application of the first embodiment, description is provided regarding a case where the method for designing a manufacturing process of the first embodiment is applied to transfer the commercial manufacturing processes of the first manufacturing facilities 68 to the second manufacturing facilities 69 in the factory including the designing division 50 and the manufacturing division 52. The trial manufacturing processes, different in part with the commercial manufacturing processes, are implemented in the second manufacturing facilities 69, based on manufacturing information which includes the features of the commercial products and the commercial manufacturing processes in the first manufacturing facilities 68. The second application of the first embodiment is different from the first application of the first embodiment in that a part of the trial manufacturing processes to be designed is changed from the commercial manufacturing processes. The rest of the second application of the first embodiment is similar to the first application of the first embodiment. Thus, duplicated description is omitted.

In step S100, the input module 32 of the TCAD system 30 in the designing division 50, shown in FIG. 4, acquires manufacturing information from the manufacturing information database 72 of the manufacturing division 52. The manufacturing information includes first features and a first electrical characteristic obtained in the commercial manufacturing processes of a first semiconductor device. The commercial manufacturing processes have been implemented in the first manufacturing facilities 68. In step S101, the simulation module 34 is calibrated by use of the obtained manufacturing information of the commercial product from the first manufacturing facilities 68.

In step S102, the manufacturing control system 66 of the manufacturing division 52 acquires a trial design specification of a second semiconductor device, from a customer. The trial design specification of the second semiconductor device includes a changed process which is different from a corresponding process in the manufacturing processes of the first semiconductor device manufactured in the first manufacturing facilities 68.

The trial design specification is transmitted from the manufacturing control system 66 to the input module 58 of the ECAD system 54 in the designing division 50, through the LAN 78. In step S103, the logic design module 60 of the ECAD system 54 designs a trial logic circuitry. Thereafter, in step S104, the layout module 62 designs a layout of the designed trial logic circuitry, by graphic data processing. For example, in the second semiconductor device described in the trial design specification, a gate length of a MOS transistor is changed to be shorter than that of the first semiconductor device. A layout pattern of the trial logic circuitry designed by the layout module 62 is stored into the design information database 56.

In step S105, based on the designed layout pattern, a plurality of trial photomasks for manufacturing the second semiconductor device are fabricated by a mask fabrication section of the manufacturing division 52 or an external mask maker (not shown).

The manufacturing control system 66 determines a manufacturing apparatus condition and a manufacturing process condition of the second manufacturing facilities 69, based on a manufacturing apparatus recipe and a manufacturing process recipe of the first manufacturing facilities 68. Here, a gate fabrication process is a changed process based on a decreased gate length. In step S106, manufacturing of a trial lot of the second semiconductor device is implemented by using the trial photomasks, under the manufacturing apparatus condition and the manufacturing process condition of the second manufacturing facilities 69. After the trial manufacturing of the second semiconductor device, a second electrical characteristic is measured in the inspection section 70. The manufacturing control system 66 stores the second features of the trial manufacturing processes, the second electrical characteristic of the second semiconductor device of a trial product, and the like, in the manufacturing information database 72.

In step S107, the input module 32 of the TCAD system 30 acquires data of the second features of the second manufacturing facilities 69 stored in the manufacturing information database 72, through the LAN 78.

An average and a variation of a gate length of a gate electrode fabricated in a gate fabrication process that is the changed process in the trial lot are substituted for the simulation module 34 of the TCAD system 30 which has been calibrated by using the manufacturing information of the commercial product. In step S108, the simulation module 34 simulates the trial manufacturing processes of the second semiconductor device, and calculates an electrical characteristic of the second semiconductor device.

In step S109, it is determined whether differences in the averages and the variations between the measured second electrical characteristic of the trial lot and the simulated electrical characteristic are within the permissible limits. When the differences in the averages and the variations between the second electrical characteristic and the simulated electrical characteristic are within the permissible limits, it is determined that the commercial production simulation of the second semiconductor device can be achieved.

In step S114, the simulation module 34 of the TCAD system 30 extracts model parameters of the second semiconductor device from the simulated electrical characteristic. The model parameters are stored in the design information database 56.

In step S115, the logic design module 60 of the ECAD system 54 reads the model parameters of the second semiconductor device from the design information database 56, and designs a logic circuitry. Based on the designed logic circuitry, the layout module 62 creates a layout pattern. Thus, photomasks for commercial production are fabricated.

In step S116, the specification creation module 38 of the TCAD system 30 creates a commercial manufacturing process design specification of the second manufacturing facilities 69, from the averages and the variations of the features obtained by the commercial production simulation of the second semiconductor device. The manufacturing process design specification of the second manufacturing facilities 69 is transmitted from the output module 40 and stored in the manufacturing information database 72. The manufacturing control system 66 reads the manufacturing process design specification of the second manufacturing facilities 69 from the manufacturing information database 72. The manufacturing control system 66 then instructs the second manufacturing facilities 69 to implement the commercial manufacturing processes of the second semiconductor device which is designed based on the design specification for the customer.

When the differences in the averages and the variations between the measured second electrical characteristic of the trial product and the calculated simulation electrical characteristic exceed the permissible limits, the TCAD system 30 verifies the trial manufacturing processes in step S110. If any abnormality is found in the manufacturing apparatus condition or the manufacturing process condition in step S111, the abnormal manufacturing apparatus condition or the abnormal manufacturing process condition is modified in step S112. The modified manufacturing apparatus condition or the modified manufacturing process condition is transmitted from the output module 40 to the manufacturing control system 66, and additional trial production is implemented in the second manufacturing facilities 69.

When there is no abnormality in the manufacturing apparatus condition or the manufacturing process condition in step S111, by verifying the commercial manufacturing processes, the simulation module 34 of the TCAD system 30 is recalibrated in step S113. The recalibrated TCAD system 30 newly simulates the trial manufacturing processes.

As described above, in the second application of the first embodiment, the data of the features of the trial product manufactured in the second manufacturing facilities 69 are substituted as the simulation parameters of the simulation module 34 of the TCAD system 30, for a manufacturing process which is changed in the second manufacturing facilities 69 depending on the specification of. the semiconductor device. With regard to the rest of the manufacturing processes which are not changed, the simulation parameters calibrated by using the features of the commercial product from the first manufacturing facilities 68 are used without change. Therefore, it is possible to detect an influence of changes in the manufacturing process in the trial manufacturing processes, on the commercial manufacturing processes.

In the second application of the first embodiment, it is determined whether the differences in the averages and the variations between the measured electrical characteristic of the trial product and the calculated simulation electrical characteristic are within permissible limits. Thus, commercial production in the trial manufacturing processes can be simulated. Therefore, the commercial manufacturing processes in the manufacturing facilities, where small scale trial production has been implemented, can be effectively designed in a shorter period of time.

Figure 12:
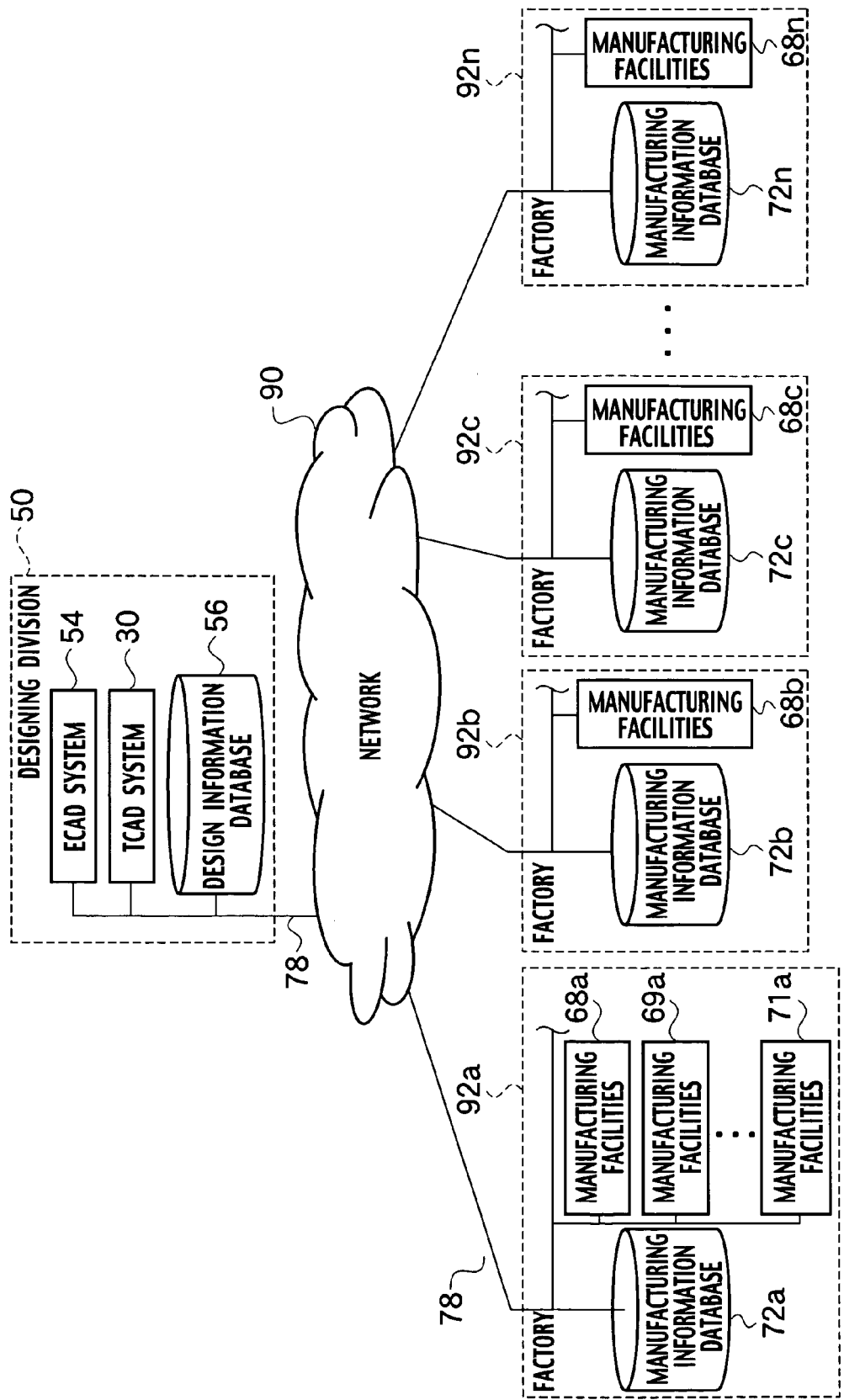
FIG. 12 is a schematic block diagram showing an exemplary factory having manufacturing facilities to implement a design method for a manufacturing process according to the first embodiment of the present invention.

Further, in the first embodiment, the commercial manufacturing processes are transferred to another manufacturing facilities in the manufacturing division 52 in the factory, as shown in FIG. 4. Moreover, the designing division 50 provided with the TCAD system 30 is located in the same factory. However, the commercial manufacturing processes may be transferred to manufacturing facilities in a different factory or in a factory of a different company. The designing division 50 may also be located in a facility outside the factory. For example, as shown in FIG. 12, the designing division 50 including the ECAD system 54, the TCAD system 30 and the design information database 56 may be connected to a plurality of factories 92a, 92b, 92c, . . . , 92n, through a network 90. The network 90 may be a wired or wireless network, internet, and the like. A LAN 78 is provided in each of the designing division 50, and the plurality of factories 92a, 92b, 92c, . . . , 92n. In the factory 92a, for example, a plurality of manufacturing facilities 68a, 69a, 71a are provided and the manufacturing information of each of the manufacturing facilities is stored in a manufacturing information database 72a. Similarly, manufacturing facilities 68b, 68c, . . . , 68n are provided in the factories 92b, 92c, . . . , 92n, respectively, and manufacturing information of each of the manufacturing facilities 68b, 68c, . . . , 68n is stored in each manufacturing information databases 72b, 72c, . . . , 72n.

When transferring semiconductor device manufacturing processes which are either the same as or partially different from the commercial manufacturing processes, the TCAD system 30 of the designing division 50 first acquires manufacturing information of commercial production facilities from among the manufacturing facilities of the plurality of factories 92a, 92b, 92c, . . . , 92n, from the manufacturing information databases 72a, 72b, 72c, . . . , 72n, through the network 90. Thereafter, simulation of the TCAD system 30 is calibrated based on the manufacturing information data of the commercial production facilities. Trial manufacturing is implemented in manufacturing facilities of a factory to which the manufacturing processes are transferred. For example, the trial manufacturing is implemented in the manufacturing facilities 68b in the factory 92b. The manufacturing information of the trial manufacturing is stored in the manufacturing information database. The TCAD system 30 acquires the manufacturing information of the trial manufacturing in the manufacturing facilities 68b, from the manufacturing information database 72b through the network 90. A simulation electrical characteristic is calculated based on the manufacturing information of the trial manufacturing and compared with a measured electrical characteristic of a trial product. Thus, the commercial production in the trial manufacturing processes in the manufacturing facilities 68b can be simulated.

Thus, in the first embodiment, the commercial manufacturing processes can be designed even for a remote factory or a factory of a different company.

SECOND EMBODIMENT

Figure 13:
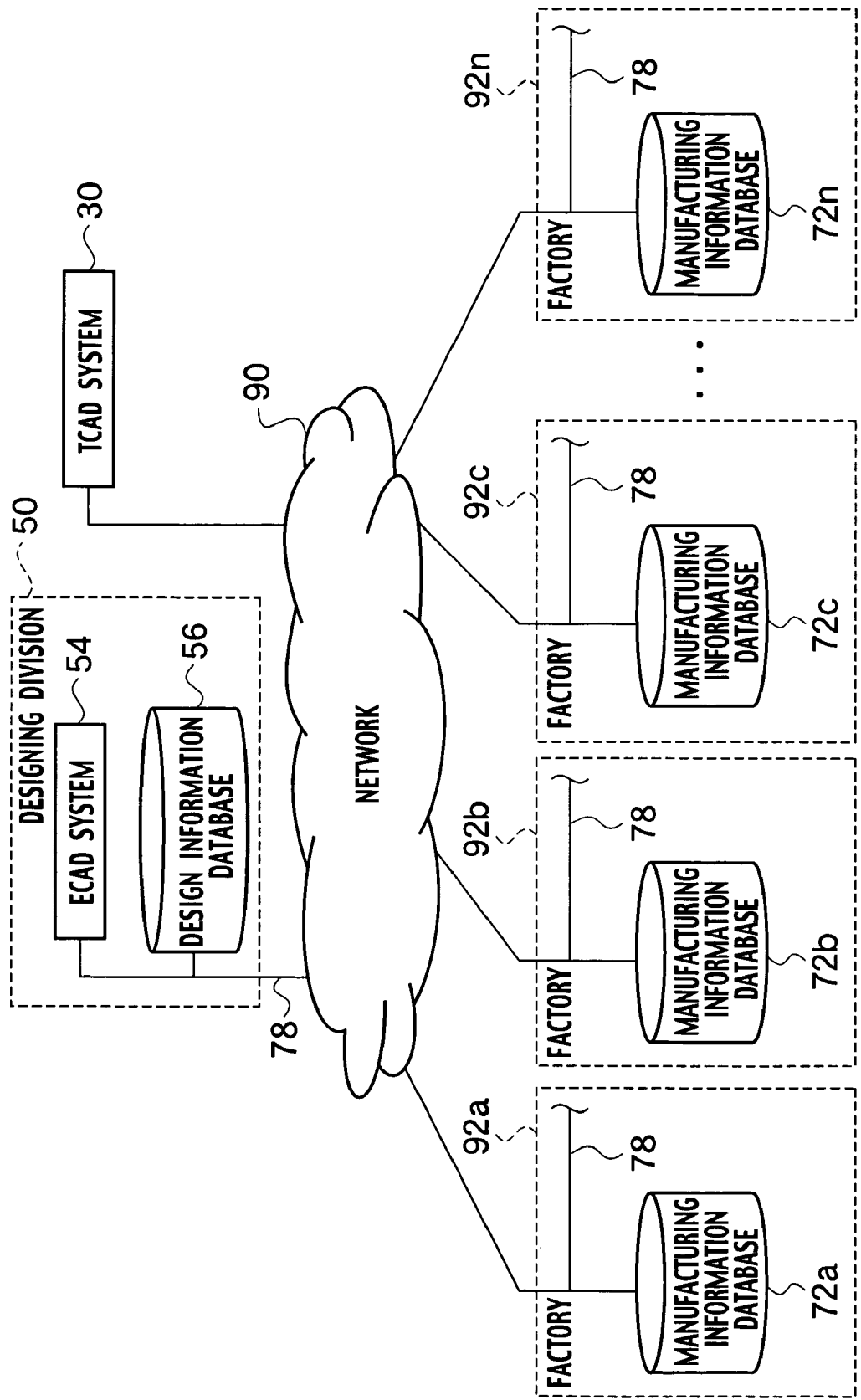
FIG. 13 is a schematic block diagram showing an exemplary factory having manufacturing facilities to implement a design method for a manufacturing process according to a second embodiment of the present invention.

In a second embodiment of the present invention, as shown in FIG. 13, a TCAD system 30 connected to a network 90 is isolated from a designing division 50a, or factories 92a, 92b, 92c, . . . , 92n. A manufacturing process design is implemented as requested by factories, which may be customers. The designing division 50a including an ECAD system 54 and a design information database 56 is connected to the network 90 through a LAN 78. The ECAD system 54 designs a logic circuitry and a layout of a logic circuitry based on design specification of a semiconductor device acquired from the factories 92a, 92b, 92c, . . . , 92n. The design information database 56 stores the layout data. The factories 92a, 92b, 92c, . . . , 92n are provided with manufacturing information databases 72a, 72b, 72c, . . . , 72n, respectively. The manufacturing information databases 72a to 72n store manufacturing information of manufacturing facilities (not shown). The factories are connected to the network 90 through the LAN 78.

The second embodiment is different from the first embodiment in that the TCAD system 30 is independent from the factories 92*a*, 92*b*, 92*c*, ..., 92*n*, which may be customers, or the designing division 50*a*, so as to provide a shared aid for the manufacturing process design. The rest of the second embodiment is similar to the first embodiment. Thus, duplicated description is omitted.

Figure 14:
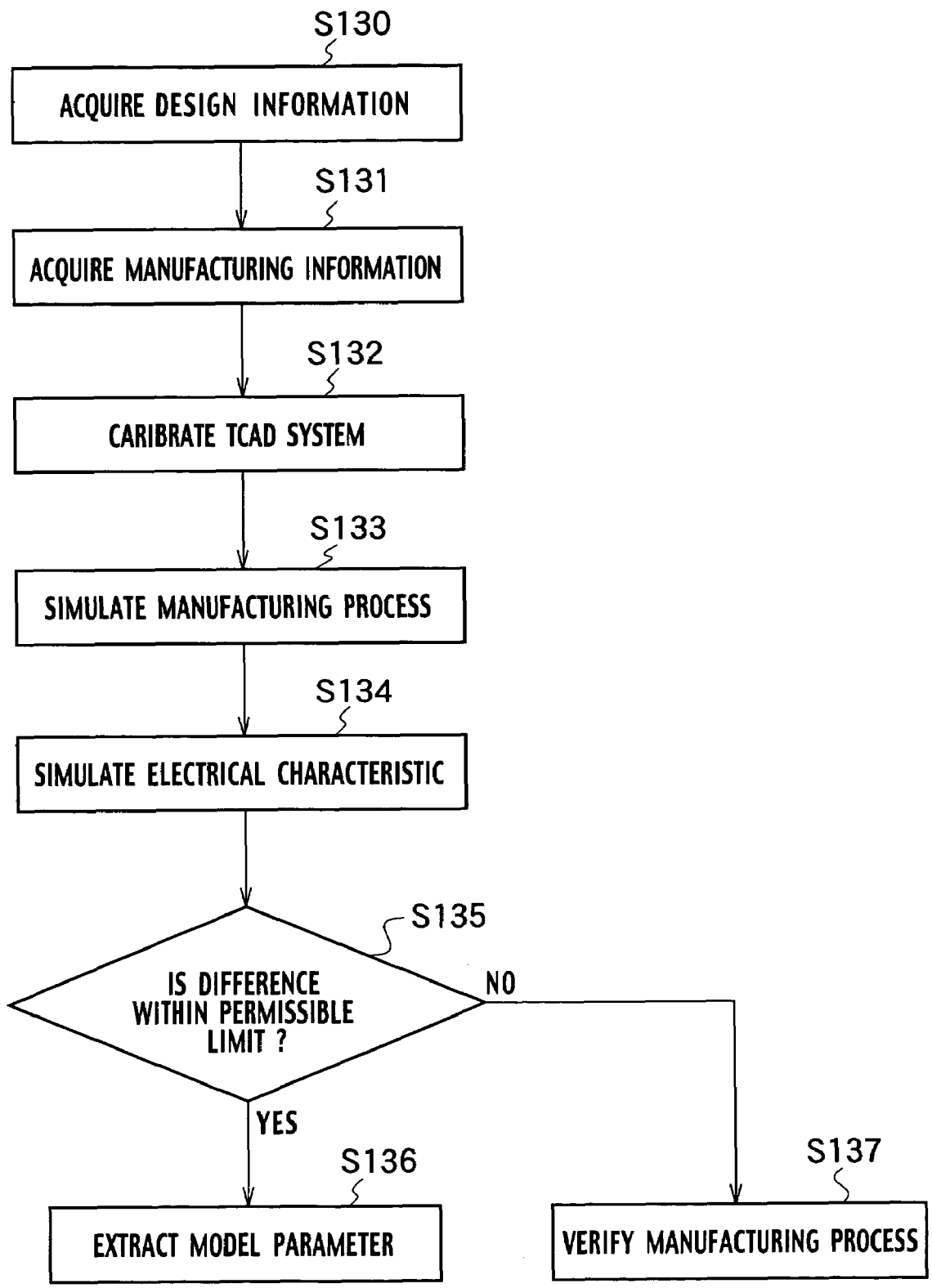
FIG. 14 is a flowchart for describing a design method for a manufacturing process according to the second embodiment of the present invention.

Description is provided with reference to the flowchart in FIG. 14, regarding a case where a customer, for example, the factory 92*a* requests a design for manufacturing processes for a semiconductor device. Here, the manufacturing information database 72*a* stores manufacturing information of commercial manufacturing processes implemented in the manufacturing facilities of the factory 92*a*. The manufacturing information database 72*a* also stores manufacturing information of trial manufacturing processes of a semiconductor device to be newly manufactured.

In step S130, the TCAD system 30 acquires the design information stored in the manufacturing information database 72*a* of the factory 92*a*, or the design information database 56 of the designing division 50*a*. The design information includes a design specification of the semiconductor device, a designed logic circuitry, and a layout pattern of the logic circuitry, and the like.

In step S131, the TCAD system 30 acquires a manufacturing process flow, a manufacturing apparatus recipe, a manufacturing process recipe, manufacturing information of a commercial production lot, manufacturing information of a trial production lot, and the like, from the manufacturing information database 72*a*.

In step S132, simulation of the TCAD system 30 is calibrated based on the manufacturing information of the commercial manufacturing processes.

In addition, in step S133, the trial manufacturing processes are simulated. In step S134, an electrical characteristic of the semiconductor device is simulated based on a result of the simulation of the trial manufacturing processes.

In step S135, it is determined whether differences in averages and variations between the measured electrical characteristic of a trial product manufactured in the trial production lot and the calculated simulation electrical characteristic are within permissible limits. When the differences in the average and the variation between the above electrical characteristics are within the permissible limits, it is determined that a semiconductor device to be newly manufactured by the trial manufacturing processes as a new commercial manufacturing processes, can be provided with an average and a variation of an electrical characteristic similar to the semiconductor device obtained as the manufacturing information of the commercial production lot. In step S136, the TCAD system 30 extracts model parameters from the simulation electrical characteristic. The extracted model parameters are transmitted to the manufacturing information database 72*a* of the factory 92*a*.

When the differences in the averages and the variations between the measured electrical characteristic of the trial product and the calculated simulation electrical characteristic exceed the permissible limits, the manufacturing processes are verified in step S137, based on the simulation of the TCAD system 30. As a result, a problematic manufacturing process is presumed and reported.

In the second embodiment, the TCAD system 30 is calibrated based on the manufacturing information of the customer. Additionally, it is determined whether the differences in the averages and the variations between the measured electrical characteristic of the trial product and the simulation electrical characteristic are within permissible limits. Thus, commercial production by the trial manufacturing processes can be simulated. Further, by extracting the model parameters, a problem involved in the trial manufacturing processes can be estimated. A customer can build commercial manufacturing processes in a short period of time in virtue of a manufacturing process design specification from the TCAD system 30. Moreover, the trial manufacturing processes may be reviewed based on a problem report for the trial manufacturing processes. Thus, an abnormal manufacturing process may be detected and modified in a shorter period of time.

OTHER EMBODIMENTS

The present invention has been described as mentioned above. However the descriptions and drawings that constitute a portion of this disclosure should not be perceived as limiting this invention. Various alternative embodiments and operational techniques will become clear to persons skilled in the art from this disclosure.

In the first and second embodiments of the present invention, the electronic device is described as a semiconductor device including a MOS transistor and a metal-insulator semiconductor (MIS) transistor. However, the electronic device is not limited to a semiconductor device, and may be a liquid crystal display, a magnetic recording device and a read head thereof, a surface acoustic wave device, and the like.

What is claimed is:

1. A computer implemented method for designing a manufacturing process of an electronic device, comprising:

calibrating a technology computer-aided design system by fitting of simulation parameters of a manufacturing process simulation and an electrical characteristic simulation, the fitting performed by using a first feature of a first commercial manufacturing process of a first electronic device manufactured by first manufacturing facilities, and a first electrical characteristic of the first electronic device;

acquiring a second feature of a trial manufacturing process of a second electronic device manufactured by second manufacturing facilities, and a second electrical characteristic of the second electronic device;

calculating a simulation electrical characteristic of the second electronic device by substituting the second feature to a simulation manufacturing process of the manufacturing process simulation, the simulation manufacturing process corresponding to the trial manufacturing process;

comparing the second electrical characteristic with the simulation electrical characteristic;

creating a design specification of a second commercial manufacturing process of the second manufacturing facilities based on a difference between the second electrical characteristic and the simulation electrical characteristic;

calculating another simulation electrical characteristic of the second electronic device by substituting a changed second feature to the simulation manufacturing process of the manufacturing process simulation using the technology computer-aided design system, when the trial manufacturing process includes a changed manufacturing process condition so as to be different from the first commercial manufacturing process, the changed second feature corresponding to the changed manufacturing process condition; and comparing the second electrical characteristic and the another simulation electrical characteristic and utilizing the comparison to verify the trial manufacturing process.

2. The method of claim 1, wherein the trial manufacturing process is implemented by a condition that is the same as the first commercial manufacturing process.

3. The method of claim 1, wherein, when the difference between the second electrical characteristic and the simulation electrical characteristic is within a permissible limit, a model parameter expressing the first electrical characteristic is provided as the design specification of the second commercial manufacturing process.

4. The method of claim 1, further comprising:
verifying the trial manufacturing process when the difference between the second electrical characteristic and the simulation electrical characteristic exceeds a permissible limit; and
modifying an abnormal manufacturing process condition when the abnormal manufacturing process condition is detected in the trial manufacturing process.

5. The method of claim 4, further comprising, verifying the first commercial manufacturing process to recalibrate the technology computer-aided design system, when the trial manufacturing process is normal from the verification of the trial manufacturing process.

6. The method of claim 1, wherein, when a difference between the second electrical characteristic and the another simulation electrical characteristic is within a permissible limit, a model parameter expressing the second electrical characteristic is extracted from the another simulation electrical characteristic, the model parameter provided as the design specification of the second commercial manufacturing process.

7. The method of claim 1, further comprising:
verifying the trial manufacturing process when the difference between the second electrical characteristic and the another simulation electrical characteristic exceeds a permissible limit; and
modifying an abnormal manufacturing process condition when the abnormal manufacturing process condition is detected in the trial manufacturing process.

8. The method of claim 7, further comprising, verifying the first commercial manufacturing process to recalibrate the technology computer-aided design system, when the trial manufacturing process is normal from the verification of the trial manufacturing process.

9. The method of claim 1, wherein the first and second manufacturing facilities are located in factories, respectively, the factories being connected to each other by a network.

10. The method of claim 1, wherein the first commercial manufacturing process and the trial manufacturing process include a gate formation process of a metal oxide semiconductor transistor.

11. The method of claim 10, wherein the first and second feature include a thickness of a gate oxide, a gate length of a gate electrode, and a thickness of a spacer incorporated in the gate.

12. The method of claim 10, wherein the first and second electrical characteristics are a threshold voltage of the metal oxide semiconductor transistor.

* * * * *